(12) United States Patent
Han

(10) Patent No.: US 6,310,389 B1
(45) Date of Patent: *Oct. 30, 2001

(54) SEMICONDUCTOR PACKAGE

(75) Inventor: Seong-young Han, Yongin (KR)

(73) Assignee: Samsung Aerospace Industries, Ltd., Changwon-si (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,559

(22) Filed: Apr. 24, 1998

(30) Foreign Application Priority Data

Apr. 28, 1997 (KR) ................................................ 97-15872

(51) Int. Cl.[7] .......................... H01L 23/495; H01L 23/58; H01L 23/10; H01L 23/34; H01L 23/06
(52) U.S. Cl. .......................... 257/668; 257/676; 257/672; 257/702; 257/707; 257/724; 257/736; 257/750; 257/759; 257/643
(58) Field of Search ..................................... 257/668, 676, 257/672, 702, 707, 729, 736, 750, 759, 643

(56) References Cited

U.S. PATENT DOCUMENTS

| | | | |
|---|---|---|---|
| 5,461,255 | * | 10/1995 | Chan et al. . |
| 5,656,856 | * | 8/1997 | Kweon . |
| 5,696,665 | * | 12/1997 | Nagy . |
| 5,791,552 | * | 8/1998 | Werther . |
| 5,945,188 | * | 8/1999 | Sei et al. . |

* cited by examiner

Primary Examiner—David E. Graybill
(74) Attorney, Agent, or Firm—Howrey Simon Arnold & White, LLP

(57) ABSTRACT

A method of manufacturing a semiconductor package including the steps of adhering inner leads to a semiconductor chip surface via an insulating adhesive, forming an insulating layer on the semiconductor chip and upper surfaces of the inner leads such that bonding pads formed on the semiconductor chip and portions of the inner leads are exposed through an opening, forming a conductive layer in the opening to electrically connect the bonding pads to the inner leads, and forming a semiconductor package by molding the semiconductor chip, the inner leads, the insulating layer, and the conductive layer with a molding material.

4 Claims, 5 Drawing Sheets

SEMICONDUCTOR PACKAGE

BACKGROUND OF THE INVENTION

1. Field of the Invention

The present invention relates to a semiconductor package, and more particularly, to a semiconductor package in which a semiconductor chip and a lead are connected by a conductive layer instead of a wire, and to a method of manufacturing the same.

2. Description of the Related Art

In a semiconductor package, a semiconductor chip is supported by a lead frame, and it is the lead of the lead frame that electrically connects the semiconductor chip to an external circuit.

Referring to FIG. 1, in a typical semiconductor package a semiconductor chip of a memory device is mounted on a pad 11, and inner leads 14 of a lead frame are attached to the pad 11 at the periphery of the semiconductor chip 12 by an adhesive 13 such as an insulating double-sided tape. The semiconductor chip 12 and the inner lead 14 are also bonded by a wire 15, and the resultant structure is sealed with molding material 16.

Meanwhile, as a semiconductor chip size becomes smaller, it has been more difficult to connect the semiconductor chip of a small-size to the lead by a wire bonding method because the distance between the inner leads (or 'pitch') is correspondingly reduced. Thus, it is difficult to bond the wire precisely to the inner leads of a fine pitch. The wire bonding method cannot be used for inner leads with a fine pitch of 0.2 mm or less, which adversely affects the reliability of the semiconductor package.

SUMMARY OF THE INVENTION

Accordingly, it is an object of the present invention to provide a method of manufacturing a semiconductor package wherein a semiconductor chip and an inner lead are connected by a conductive layer rather than by a wire so that an inner lead of a fine pitch and a semiconductor chip may be precisely connected.

To achieve the above object, the present invention provides a method of manufacturing a semiconductor package including the steps of adhering inner leads to a semiconductor chip surface via an insulator, forming an insulating layer on the semiconductor chip and upper surfaces of the inner leads such that bonding pads formed on the semiconductor chip and portions of the inner leads are exposed through an opening, forming a conductive layer in the opening to electrically connect the bonding pads to the inner leads, and forming a semiconductor package by molding the semiconductor chip, the inner leads, the insulating layer, and the conductive layer with a molding material.

The step of forming the insulating layer includes the steps of forming a first insulating layer on the upper surface of the semiconductor chip where the bonding pads are not formed, and forming a second insulating layer on the upper surface of the first insulating layer and on portions of the upper surface of the inner leads except for end portions thereof.

Preferably, the second insulating layer is composed of at least two layers.

It is also preferable that the upper surface of the first insulating layer is level with that of the inner leads.

According to another aspect of the present invention, there is provided a semiconductor package including a semiconductor chip having bonding pads formed thereon, a plurality of inner leads adhered to said semiconductor chip via an insulating adhesive, a plurality of insulating layers coated on the inner leads and on portions of the semiconductor chip where the bonding pads are not formed, and a conductive layer electrically connecting the inner leads to the bonding pads.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

A semiconductor chip and inner leads are electrically connected by a conductive layer according to the present invention. A method of manufacturing a semiconductor package according to the present invention is described with reference to FIGS. 2 through 8.

Figure 1:
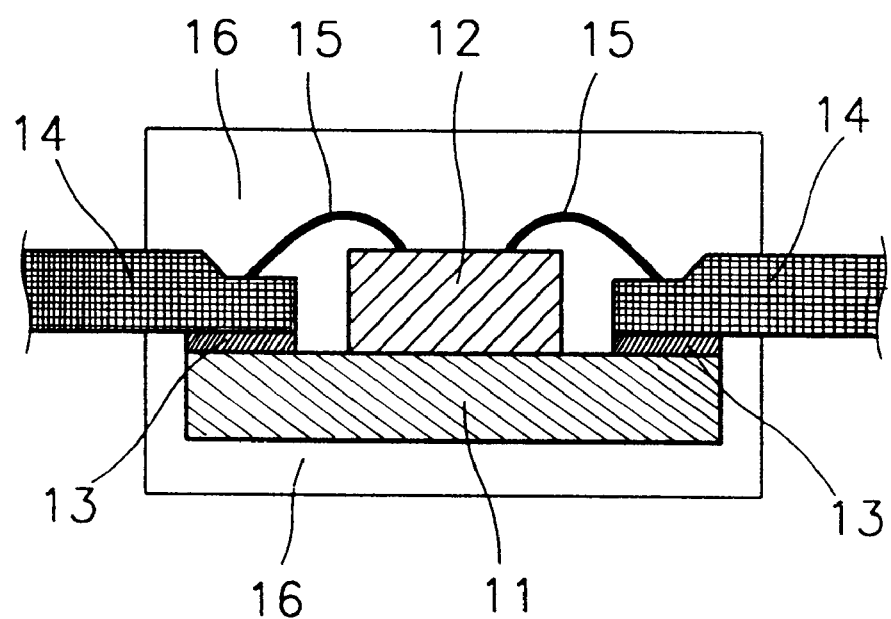
FIG. 1 is a sectional view of a conventional semiconductor package.
Figure 2:
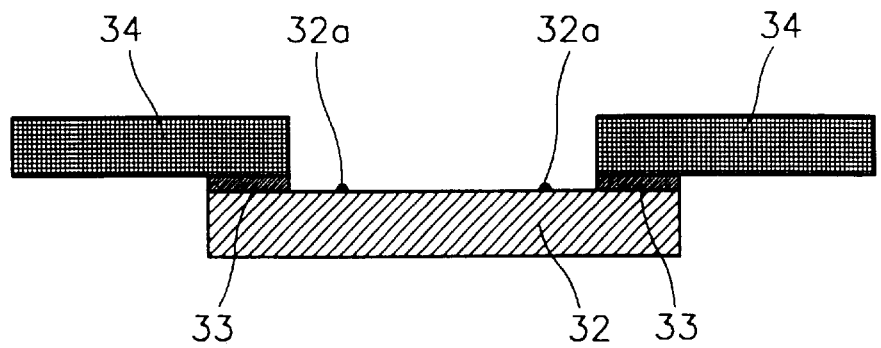
FIGS. 2 through 8 illustrate a method of manufacturing a semiconductor package according to an embodiment of the present invention.

Referring to FIG. 2, inner leads 34 of a lead frame are attached to an edge of the surface of a semiconductor chip 32 where a bonding pads (electrical connection terminals) 32a, are formed. Preferably, the inner leads 34 are attached by an insulating adhesive 33 such as an insulating double-sided tape.

Figure 3:
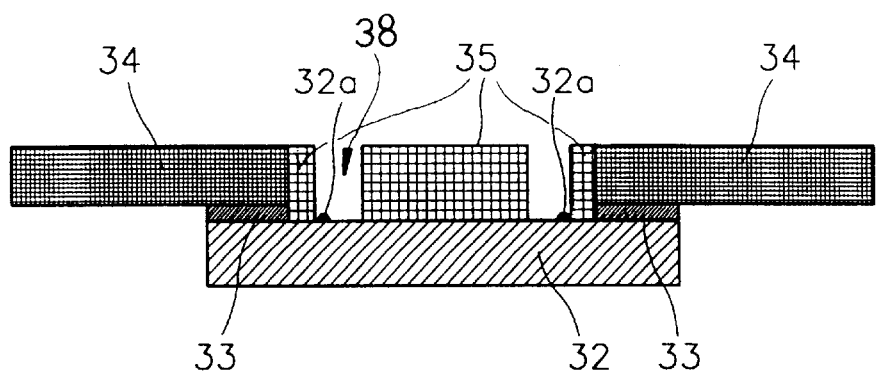

Then, as shown in FIG. 3, first insulating layer 35 is formed on an upper surface of the semiconductor chip 32 where the bonding pads 32a are not formed. Thus, the bonding pads 32a are exposed through openings 38. Preferably, the upper surface of the first insulating layer 35 is level with the upper surface of the inner leads 34.

Preferably, the first insulating layer 35 includes a polyamide group. The first insulating layer 35 can be formed by a dispensing method in which an insulating material is repeatedly coated to form a predetermined pattern. Alternatively, the insulating layer can be formed by attaching insulating tape of a predetermined pattern.

Figure 4:
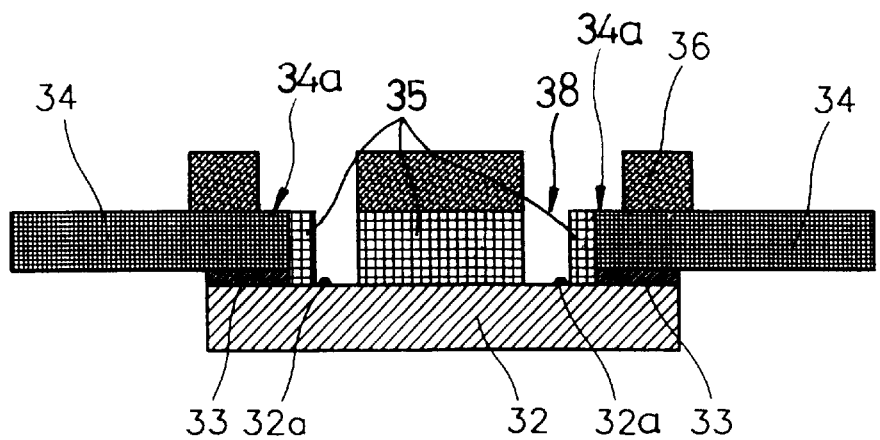

Subsequently, referring to FIG. 4, second insulating layers 36 are formed on the upper surface of the first insulating layer 35 and on the upper surfaces of the inner leads 34 except for end portions 34a thereof. Thus, the bonding pads 32a of the semiconductor chip 32 are still exposed through openings 38, and the upper surface portions 34a of ends of the inner leads are also exposed. The material and method of formation of the second insulating layer 36 may be the same as for the first insulating layer 35. The first and second insulating layers 35 and 36 are separately formed for the convenience of layer deposition.

Figure 5:
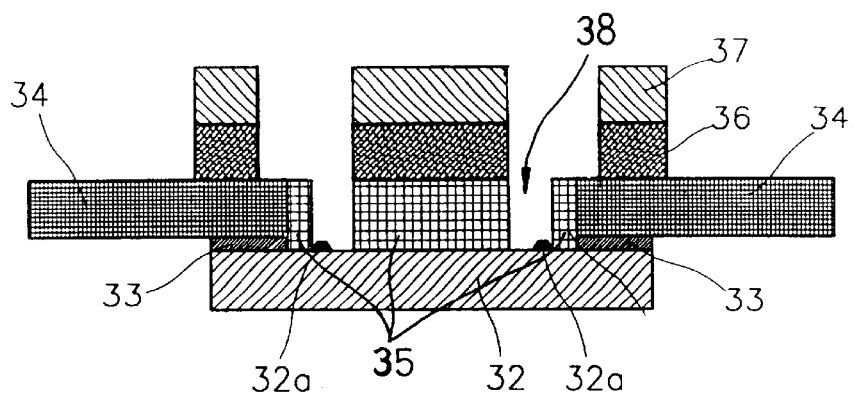

Next, as shown in FIG. 5, third insulating layers 37 are formed on the upper surfaces of the second insulating layers 36. The third insulating layer 37 increases a depth of the opening 38. The material and method of formation of the third insulating layer 37 may be the same as for the first and second insulating layers 35 and 36.

Figure 6:
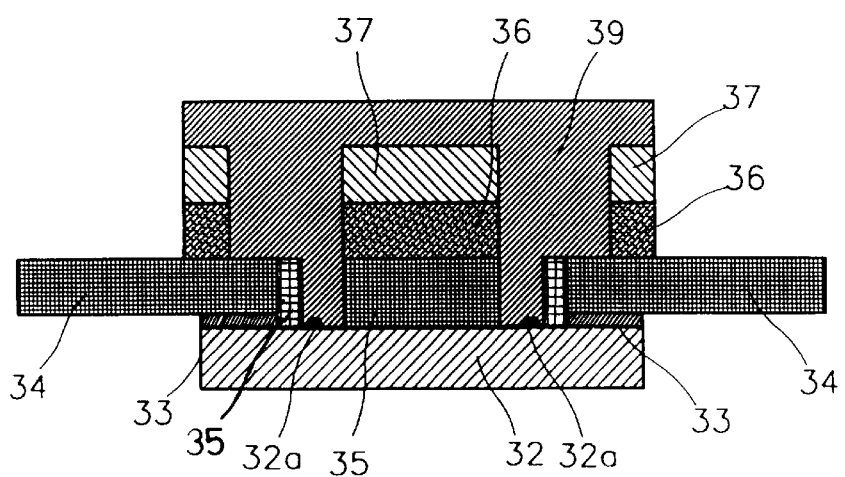

Referring to FIG. 6, when the first, second and third insulating layers 35, 36 and 37 are completed, a conductive material such as conductive ink, for example, is poured into the opening 38 to form a conductive layer 39. The conductive layer 39 covers the exposed upper surface portions 34a of the inner leads 34 (see FIG. 4), the bonding pads 32a of the semiconductor chip 35, and the upper surfaces of the third insulating layers 37.

Figure 7:
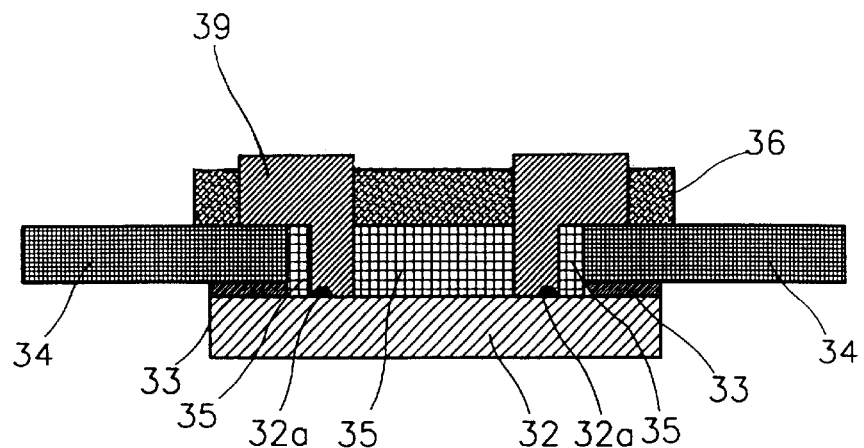

Then, referring to FIG. 7, the third insulating layers 37 and part of the conductive layer 39 covering the third insulating layers 37 are eliminated. This prevents an electrical short between adjacent leads due to overspreading of the conductive layer coated on the upper surface of the third insulating layer 37.

Now, the conductive layer 39 electrically connects the inner leads 34 to the semiconductor chip 32 via the bonding pads 32a.

Figure 8:
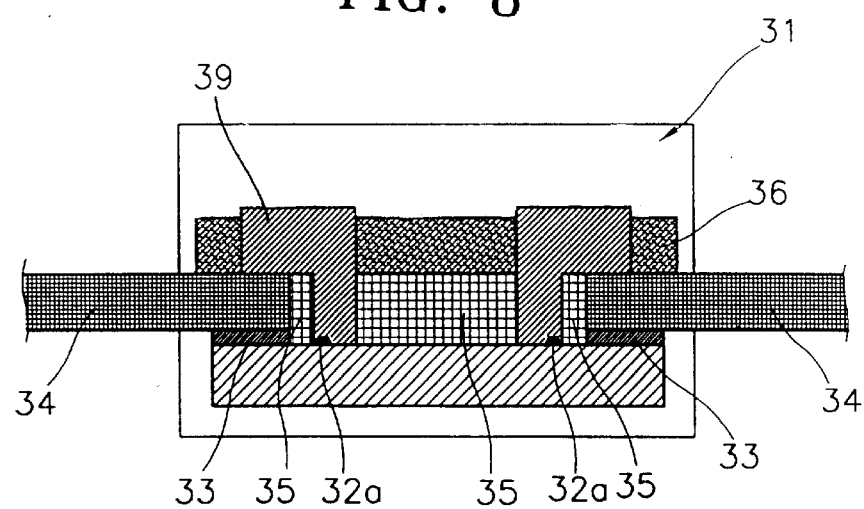

Lastly, as shown in FIG. 8, the semiconductor chip 32 where the first and second insulating layers 35 and 36 are formed and the inner leads 34 are molded by molding material 31, to thereby complete the semiconductor package. At this time, the other end of the inner lead 34 is protruded outward.

According to the present embodiment, the semiconductor chip 32 and the inner leads 34a are electrically connected by the conductive layer 39 rather than by conventional wires.

Figure 9:
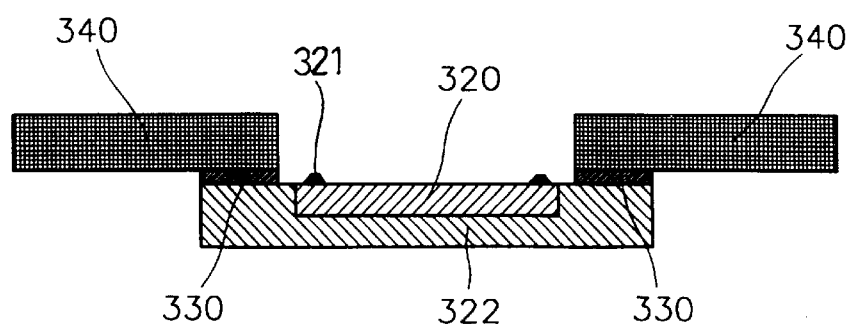
FIGS. 9 and 10 illustrate a method of manufacturing a semiconductor package according to another embodiment of the present invention.

The present invention can be applied to various semiconductor packages. For example, in manufacturing the semiconductor package as shown in FIG. 9, a semiconductor chip 320 is supported by a pad 322 and the inner leads 340 are attached via an insulating adhesive 330 to edges of the pad 322 instead of the semiconductor chip 320 itself. First and second insulating layers 350, 360 are added in a fashion similar to that described in the first embodiment.

Figure 10:
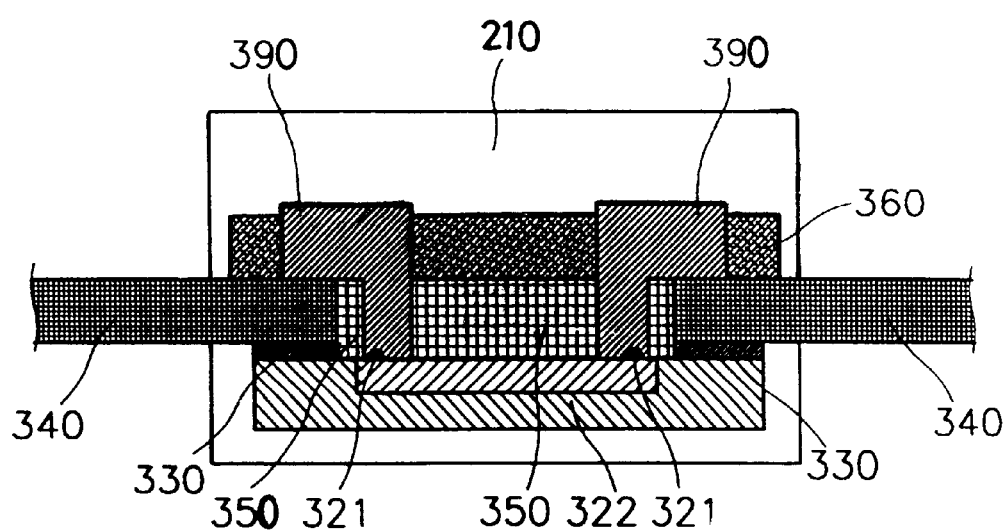

Then, bonding pads 321 of the semiconductor chip 320 and the inner leads 340 are connected by a conductive layer 390 in the same manner as described above. A completed semiconductor package 210 is shown in FIG. 10.

According to the present invention, the semiconductor chip and the inner leads are connected by a conductive layer which ensures a more precise connection. Thus, connection of inner leads of fine pitches is realized, which increases the reliability of the semiconductor package.

What is claimed is:

1. A semiconductor package, comprising:

a semiconductor chip having a bonding pad formed thereon;

an inner lead adhered to said semiconductor chip via an insulating adhesive;

a first insulating layer coated on said inner lead and on said semiconductor chip to form an insulative path for conductive material between the bonding pad and said inner lead, wherein the insulative path prevents electrical short-circuit between adjacent bonding pads and inner leads;

a conductive layer formed of the conductive material in the opening and electrically connecting the bonding pad to said inner lead; and a second insulating layer that encapsulates the semiconductor package.

2. The semiconductor package of claim 1, wherein said insulating layer comprises a polyamide group.

3. The semiconductor package of claim 1, wherein said conductive layer is formed by pouring a conductive material into the opening.

4. The semiconductor package of claim 3, wherein the conductive material comprises a conductive ink.

* * * * *